United States Patent
Carroll

(10) Patent No.: US 7,271,660 B1
(45) Date of Patent: Sep. 18, 2007

(54) SELECTIVELY ADDING AUXILIARY FREQUENCY COMPENSATION DEPENDING ON THE BEHAVIOUR OF AN OUTPUT TRANSISTOR OF A RAIL-TO-RAIL OPERATIONAL AMPLIFIER

(75) Inventor: Kenneth J. Carroll, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 90 days.

(21) Appl. No.: 11/127,845

(22) Filed: May 11, 2005

(51) Int. Cl.
*H03F 1/14* (2006.01)
(52) U.S. Cl. ............... 330/292; 330/294; 330/109
(58) Field of Classification Search ......... 330/292, 330/294, 109
See application file for complete search history.

(56) References Cited

U.S. PATENT DOCUMENTS

| | | | | |
|---|---|---|---|---|
| 5,150,270 A | * | 9/1992 | Ernst et al. ............ | 361/64 |
| 5,546,045 A | * | 8/1996 | Sauer ................... | 327/561 |
| 5,548,205 A | * | 8/1996 | Monticelli .............. | 323/274 |
| 6,384,687 B1 | * | 5/2002 | Maida ................... | 330/296 |
| 6,515,540 B1 | * | 2/2003 | Prasad et al. ......... | 330/9 |
| 2006/0132112 A1 | * | 6/2006 | Oswald et al. ........ | 323/282 |

* cited by examiner

*Primary Examiner*—Patricia Nguyen

(57) ABSTRACT

A frequency compensation device for providing added compensation to an operational amplifier, such as a bipolar or MOS rail-to-rail output operational amplifier, when the output device of the operational amplifier is in saturation. The device comprises a detector circuit for detecting those conditions which can cause the output device to go into saturation. When saturation is detected, an auxiliary frequency compensation device provides added frequency. Thereby, in a normal mode of operation, the op-amp is not overcompensated. Yet, when an output device becomes saturated, the auxiliary compensation is added to improve stability and prevent the op-amp from becoming oscillatory.

21 Claims, 6 Drawing Sheets

SELECTIVELY ADDING AUXILIARY FREQUENCY COMPENSATION DEPENDING ON THE BEHAVIOUR OF AN OUTPUT TRANSISTOR OF A RAIL-TO-RAIL OPERATIONAL AMPLIFIER

BACKGROUND

1. Field

The present invention relates to rail-to-rail operational amplifiers (op-amps). More particularly, the present invention selectively adds auxiliary frequency compensation, depending on the behavior of an output transistor of the op-amp.

2. Background

Today, virtually every electronic circuit contains one or more operational amplifiers (op-amps). Basically, an op-amp is used to amplify an input signal. General use of op-amps has been extended to include applications such as DC amplifiers, AC amplifiers, comparators, servo valve drivers, deflection yoke drivers, low distortion oscillators, AC to DC converters, multivibrators, and many other applications. As electronic circuits become more complex, performance requirements are becoming more stringent, leaving designers with more difficult specifications to comply with and less flexibility to meet those difficult specification requirements. For example, with the proliferation of wireless communication (e.g., cell phones, pdas, laptops, etc.), electronic devices are becoming smaller, lighter, and are typically run off of batteries. For battery powered electronic devices, low power consumption is of critical importance. Consequently, many of these electronic devices require op-amps to operate with low supply voltage and low quiescent current. Due to the stringent requirements of low voltage applications, op-amps are being specifically designed to make use of the entire dynamic range offered by the power supply. In other words, the output stage of these op-amps are driven towards the upper and lower supply voltages (the "rails"). This has lead to the design of what is commonly referred to as "rail-to-rail" op-amps.

Unfortunately, when the output stage of a rail-to-rail op-amp is driven towards the upper and lower supply voltages, the output bipolar transistors are prone to becoming "saturated." When the output bipolar transistors become saturated, the entire frequency response of the op-amp is detrimentally affected. In extreme cases, the op-amp can be caused to enter oscillation. An oscillatory op-amp may render the electronic device unusable or otherwise result in malfunctions.

In order to stabilize the op-amp and otherwise prevent oscillation, some form of frequency compensation is typically implemented. FIG. 1 shows a typical prior art op-amp with compensation circuitry. Op-amp 101 is comprised of an input stage 102. Input stage 102 is typically a differential pair for accepting the positive and negative input signals. A gain stage 103 follows the input stage 103. Gain stage 103 provides high voltage gain. The output stage 104, which provides high current driving capability, is coupled to the gain stage 103. Additionally, in a rail-to-rail configuration, the output stage is also a voltage gain stage. A frequency compensation circuit 105 is added to provide the requisite frequency compensation.

When choosing the degree of frequency compensation to be implemented, the worst-case scenario is often taken into account. The worst-case scenario typically arises when one or both of the op-amp's output bipolar transistors is in saturation. In order to address this possibility, most frequency compensation circuits are designed to prevent the op-amp from entering oscillation, even if either or both of the output bipolar transistors become saturated. In other words, the op-amp is overcompensated in case the output bipolar transistors ever become saturated. Unfortunately, this results in the op-amp being overcompensated when it is running in its normal (i.e., non-saturated) mode of operation. This overcompensation is undesirable because it degrades the frequency response of the op-amp.

Thus, designers are faced with a dilemma. On the one hand, a bipolar rail-to-rail op-amp can be designed to consider the worst-case scenario, by compensating for it. The advantage of this approach is that the op-amp is guaranteed to operate in a totally reliable and predictable manner, in spite of saturated output transistors. The disadvantage to this approach is that when the op-amp operates normally, the overcompensation results in a degraded frequency response. On the other hand, a bipolar rail-to-rail op-amp can be designed with minimal frequency compensation. The op-amp can thereby run near or at its peak frequency potential under most normal conditions. However, the downside is that, should a situation arise which exceeds the compensation capability of that op-amp, the op-amp might cease to work properly.

This problem is also manifest in MOS output rail-to-rail op-amps as well as in the bipolar output rail-to-rail op-amp described above. However, in a MOS device, what is called "saturation" in a bipolar transistor, is referred to as the "linear" or "resistive" region. In this linear region, also encountered when the MOS op-amp output node voltage approaches one or the other supply potential, the MOS device's characteristics are heavily compromised.

SUMMARY

Embodiments pertain to a frequency compensation circuit for bipolar rail-to-rail output op-amp. The frequency compensation device includes a detector circuit for detecting conditions which can cause an output device of the op-amp to become saturated. A switch is coupled to the detector circuit that is responsive to when saturation is detected. An auxiliary frequency compensation circuit coupled to and controlled by the switch, provides added frequency compensation to the op-amp. The frequency compensation circuit provides added compensation only when saturation at the output of the op-amp is detected. Thereby, in a normal mode of operation, the op-amp is not overcompensated. Yet, when an output device becomes saturated, the auxiliary compensation is switched in to improve stability and prevent the op-amp from becoming oscillatory.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An apparatus and method for selectively adding auxiliary frequency compensation, depending on the behavior of an output transistor of the op-amp, is disclosed.

Figure 1:
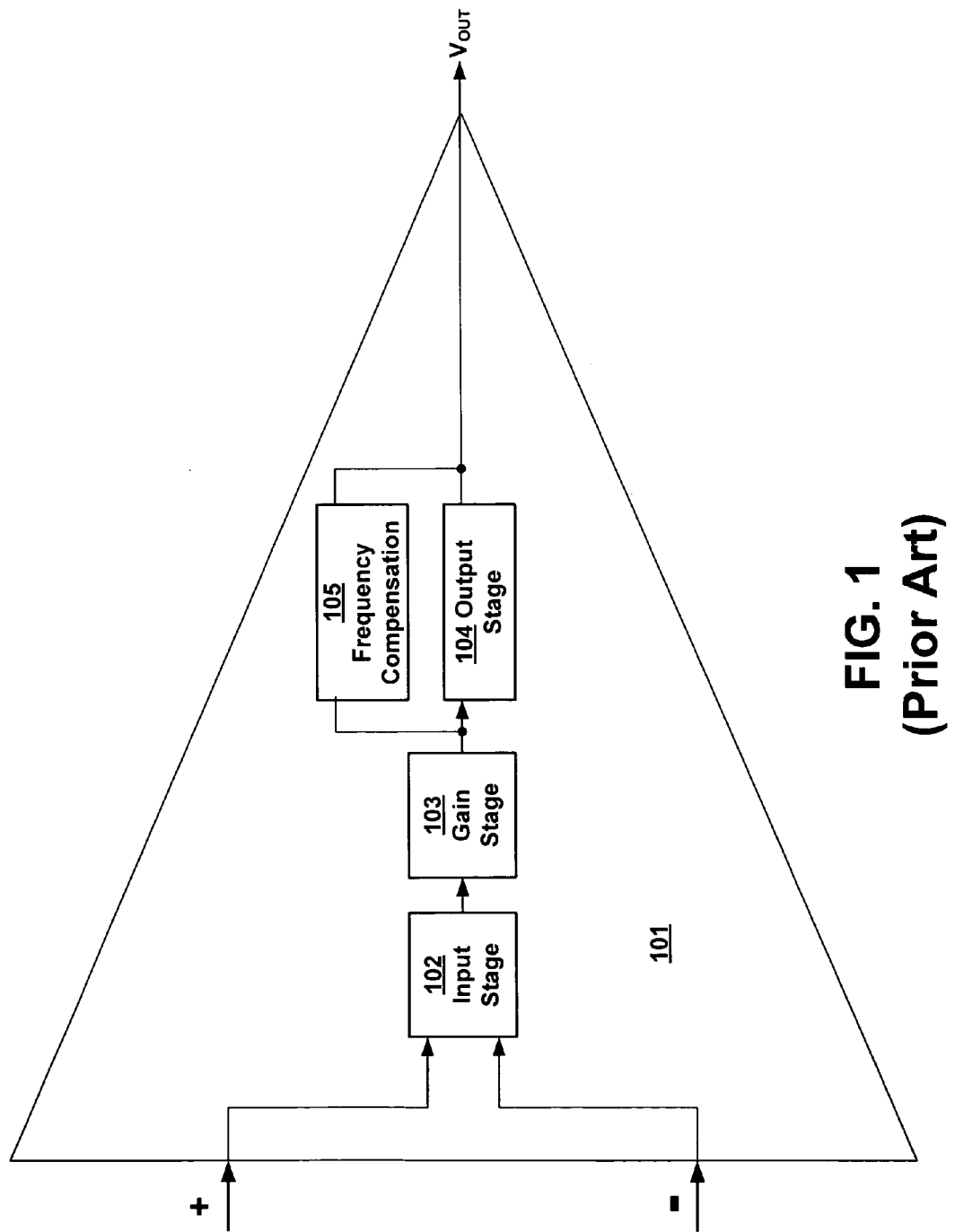
FIG. 1 shows a typical prior art op-amp with compensation circuitry.
Figure 2:
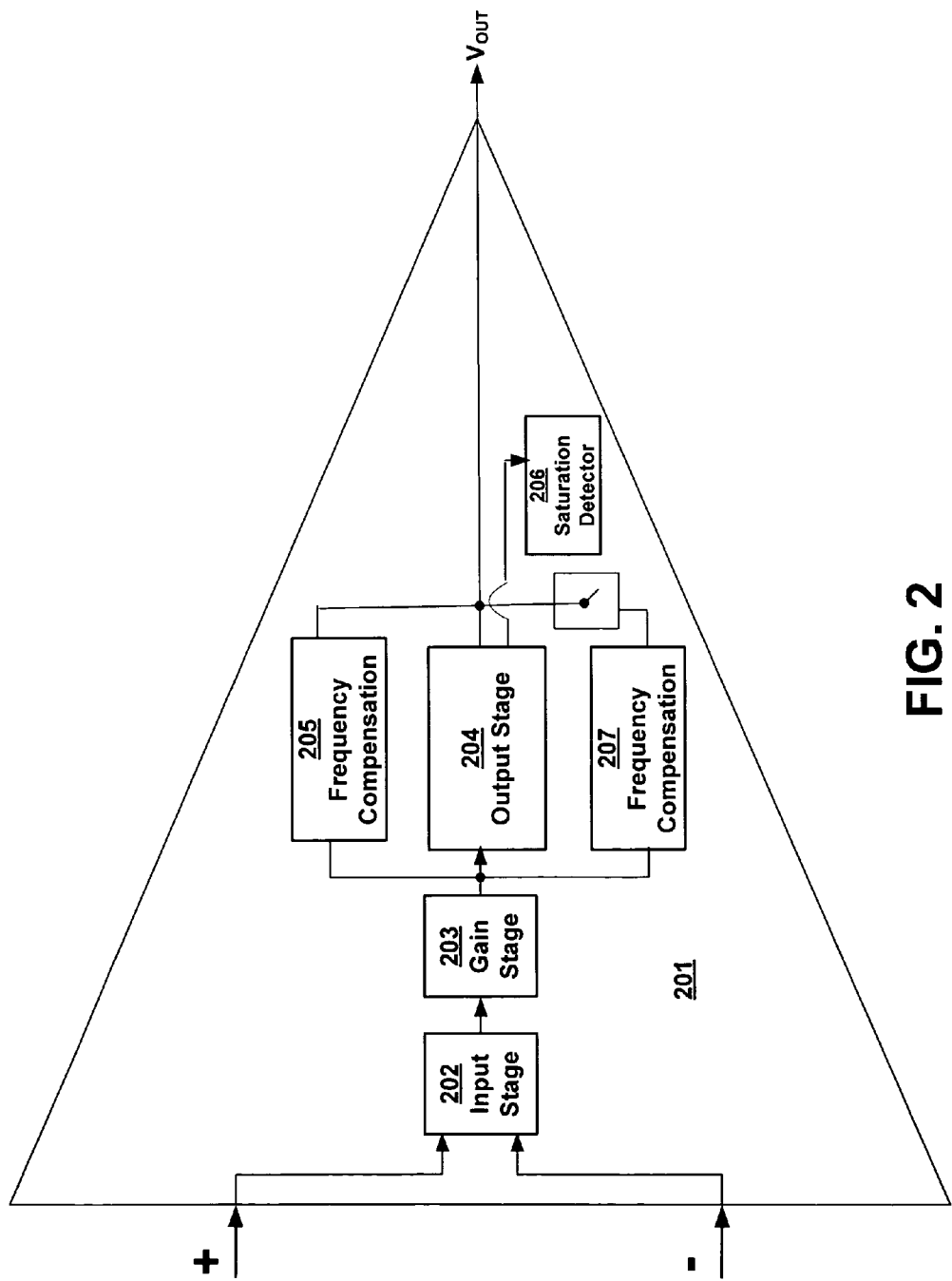
FIG. 2 shows a block diagram of an op-amp upon which embodiments of the present invention may be implemented.

FIG. 2 shows a block diagram of an op-amp upon which embodiments of the present invention may be implemented. The positive and negative inputs to op-amp 201 are input to an input stage 202 (e.g., a differential pair stage). The signal from the input stage 202 is then amplified by gain stage 203. The two gain stage 204 provides additional gain and drives the output signal. A frequency compensation circuit 205 is used to provide frequency compensation for stages 203 and 204. Frequency compensation circuit 205 can be a passive circuit (e.g., a capacitor, inductor, or some RLC combination circuit). Alternatively, frequency compensation circuit 205 can be an active circuit. The degree of frequency compensation is selected to be optimal for normal operation of the op-amp 201. In other words, the degree of frequency compensation is optimized for when the output signal falls within some normal range of operation which does not result in saturating any of the output transistors. The typical normal range of operation is + or − a small voltage difference off of the positive and negative rails. Thus, in its normal mode of operation, the op-amp 201 is fairly compensated. Consequently, op-amp 201 is predominantly run at or near its peak A.C. performance.

If, however, the output signal results in driving one or more of the transistors corresponding to output stage 204 into saturation, this condition is detected by saturation detector 206. There are many different ways by which saturation can be detected. One way is to use anti-saturation clamps in an inverse mode. Alternatively, one or more transistors can be specifically implemented to be triggered (e.g., either turned on or turned off) when encountering the conditions which would result in an output transistor becoming saturated. When saturation detector 206 detects a saturation condition, it causes an auxiliary frequency compensation circuit 207 to be switched in to provide additional frequency compensation to the gain stages 203 and 204. Auxiliary frequency compensation circuit 207 can be the same type of circuit as or different from that of frequency compensation circuit 205. Auxiliary frequency compensation circuit 207 provides extra frequency compensation above and beyond that afforded by the normal frequency compensation circuit 205. This extra degree of frequency compensation is selected to keep the op-amp 201 working properly in spite of one or more output transistors being saturated. It is far better to have op-amp 201 working properly, although at a reduced performance level, than to have it break down and "fly" into oscillations.

This scheme resolves two issues. First, in its normal mode of operation, which may occur 99% of the time, the op-amp is only compensated by frequency compensation circuit 205. The auxiliary frequency compensation circuit 207 is not switched in, and hence, does not affect the output stage when op-amp 201 is in its normal mode of operation. Consequently, op-amp 201 is not overcompensated during its normal mode of operation and can run at or near its optimal performance level. Second, if any of the output transistors ever become saturated, this condition is detected, and then and only then does the auxiliary frequency compensation 207 get switched in to affect the frequency response of gain stages 203 and 204. Adding in extra frequency compensation serves to prevent op-amp 201 from going oscillatory. Thus, embodiments of the present invention enable op-amp 201 to run at or near its peak performance when output transistors are not saturated, yet op-amp 201 is prevented from going into oscillations when, and if, one or more output transistors ever become saturated.

In one embodiment, there is no auxiliary frequency compensation circuit 207 and frequency compensation circuit 205 is normally not switched in. Instead, when saturation is detected, the saturation detector switches in the dedicated frequency compensation circuit 205 to provide the frequency compensation necessary to prevent op-amp 201 from going into oscillations.

Figure 3:
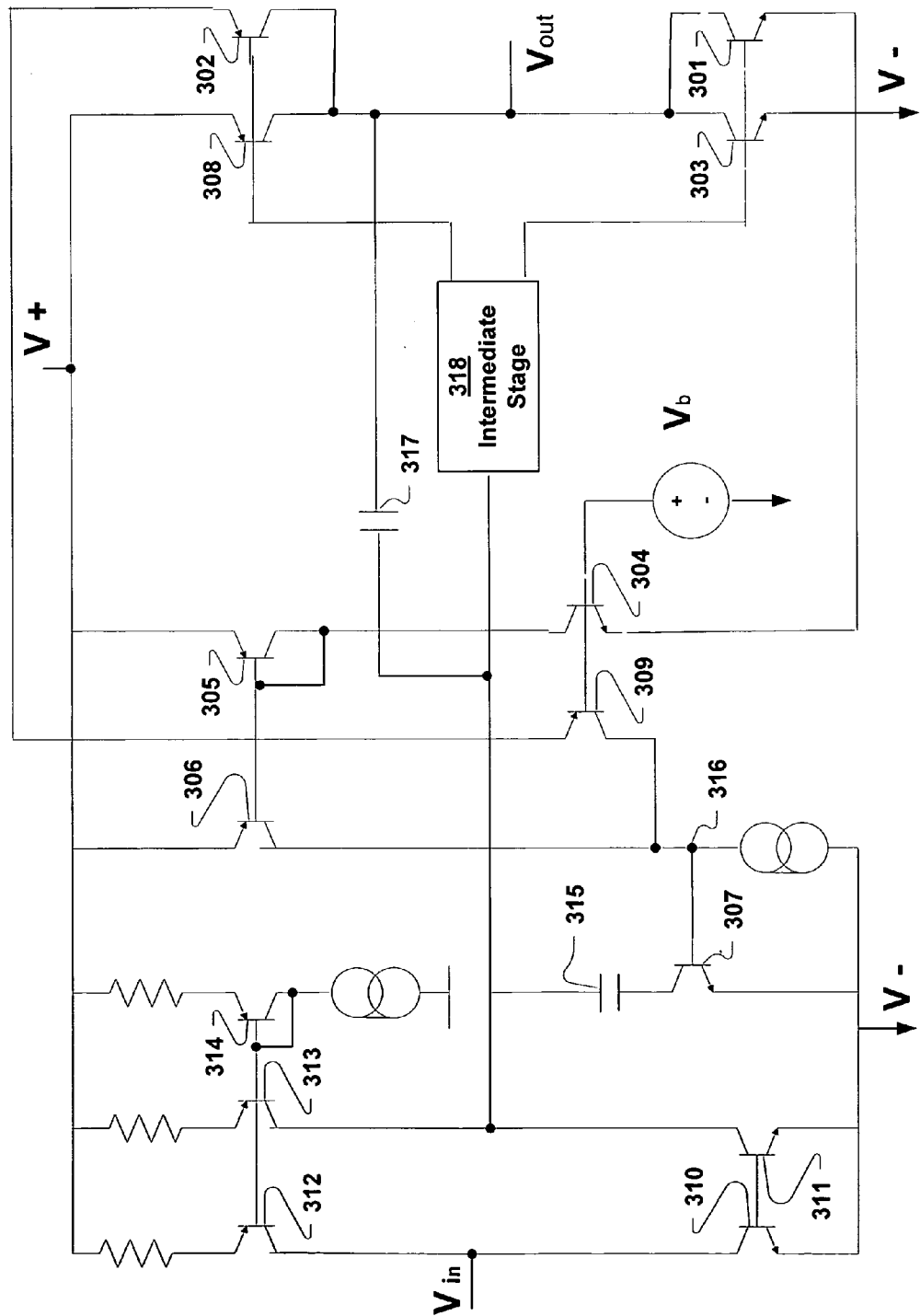
FIG. 3 shows an embodiment of the present invention as applied to a bipolar rail-to-rail op-amp.

FIG. 3 shows an embodiment of the present invention as applied to a bipolar rail-to-rail op-amp. Transistors 301 and 302 are conventional "anti-saturation clamps." In the case of the output voltage $V_{OUT}$ going towards the negative supply rail V⁻, the output NPN transistor 303 will begin to go into saturation once its collector voltage falls below its base voltage. The lower $V_{OUT}$ goes, the more saturated NPN transistor 303 becomes. NPN transistor 301 is connected so that under these conditions, it operates as an inverse mode transistor. In other words, once its base collector junction starts to forward bias, its collector operates as an emitter and its emitter acts as a collector. Thus, the saturation condition of NPN transistor 303 is sensed by NPN transistor 301. The base and collector of NPN transistor 301 are connected to the base and collector of NPN transistor 303, respectively. When NPN transistor 303 enters saturation, the emitter of NPN transistor 301 is now behaving as a collector. Consequently, it draws current from the emitter of cascode NPN transistor 304. This current is replicated by current mirror PNP transistor 305 and PNP transistor 306. This current is fed to the base of NPN transistor 307.

Once the collector current of PNP transistor 306 exceeds the bleed current, $I_b$, connected to the base of NPN transistor 307, then NPN transistor 307 will turn on. In turn, this effectively connects the bottom plate of capacitor 315 to ground. Thus, a means of frequency compensation is enabled which had hitherto not been enabled prior to the saturation of the output NPN transistor 303.

Similarly, when the output voltage, $V_{out}$, goes towards V+, PNP transistor 302 performs the identical function for output PNP transistor 308 that NPN transistor 301 did for NPN transistor 303. The inverse mode "collector" current of PNP transistor 302 is fed via cascode PNP transistor 309 to the base of NPN transistor 307.

It should be noted that the point at which saturation is "detected" can be influenced by the sizing of NPN transistor 301 relative to that of NPN transistor 303. Likewise, the point of detecting saturation for output PNP transistor 302 can be set by its relative size to the size of PNP transistor 308. Other means for setting the point of detection can include, but are not limited to, the sizing of current mirror output PNP transistor 306 to input PNP transistor 305. Yet another means for influencing the saturation detection point is the magnitude of the bleed current, $I_b$. The bleed current, $I_b$, is implemented to counteract any leakage currents or other influences on node 316. Cascode NPN transistors 304 and 309 may or may not be necessary, depending on the details of the semiconductor process used to fabricate the op-amp. Furthermore, the voltage source, Vb, is a simple DC bias means and may be created in many different ways.

The auxiliary capacitor 315, switched in by the occurrence of output transistor saturation, may be in parallel with an existing compensation capacitor 317. In an alternative embodiment, auxiliary capacitor 315 may be in a completely different portion of the circuit, as dictated by the circuit design itself. In this embodiment, NPN transistors 310-311, PNP transistors 312-314, Ibias, and the intermediate stage 318 are possible implementations of a conventional op-amp onto which embodiments of the present invention may be added.

The advantage of this circuit is that the frequency compensation does not have to take into account the difficult condition of output saturation since an additional auxiliary circuit will handle this situation. In contrast, prior art circuits may have to be designed to be overcompensated when not in the saturated state just so as to be stable in the saturated state. This results in reduced performance in the non-saturated state for the prior art circuits.

It should be noted that any active device with different configurations may be used. For example, more than one capacitor in parallel or in series or combination may be used. Similarly, an inductor may be used that may be in parallel or in series or in combination. Furthermore, more than one kind of active device may be used. For example, capacitors may be used in conjunction with inductors that may be configured in series, parallel, or a combination of parallel and series configuration.

Figure 4:
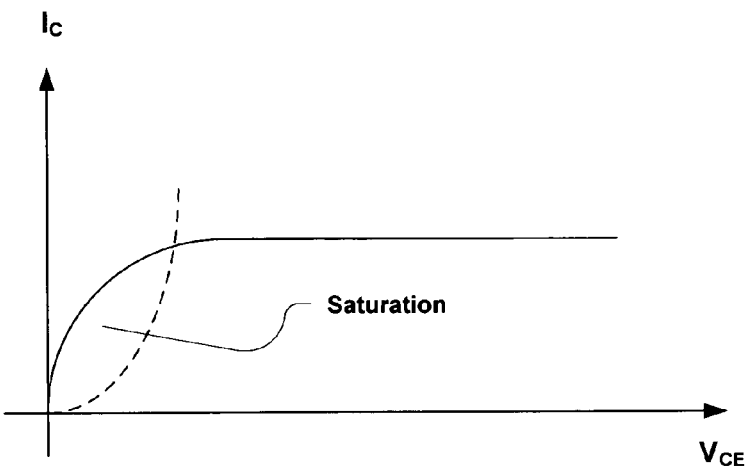
FIG. 4 shows the saturation region corresponding to a bipolar transistor.
Figure 5:
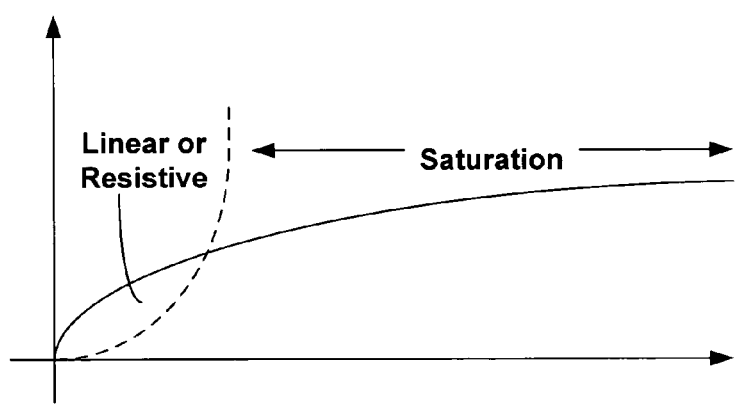
FIG. 5 shows the linear or resistive region of a MOS transistor.

In an alternative embodiment, auxiliary compensation can be selectively added to metal-oxide-semiconductor (MOS) rail-to-rail op-amps. In a MOS device, what is called "saturation" in a bipolar transistor, is referred to as the "linear" or "resistive" region, as depicted in FIGS. 4 and 5. FIG. 4 shows the saturation region corresponding to a bipolar transistor. In comparison, FIG. 5 shows the linear or resistive region of a MOS transistor.

Figure 6:
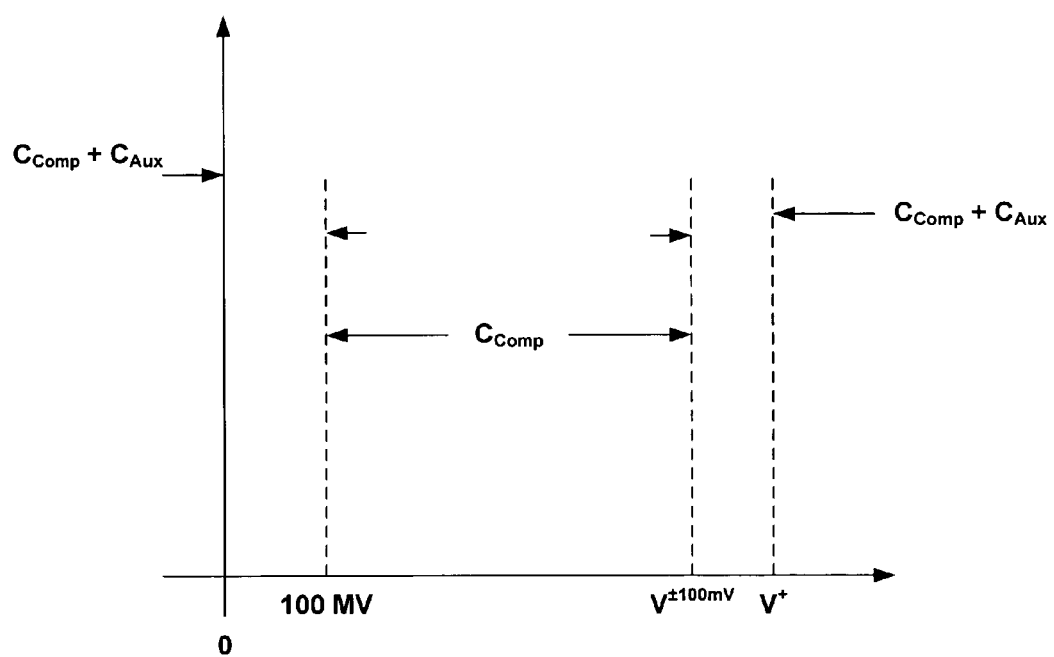
FIG. 6 shows a chart depicting when normal compensation and auxiliary compensation are applied.

In a MOS rail-to-rail op-amp, auxiliary compensation is added when the output voltage approaches the rails. FIG. 6 shows a chart depicting when normal compensation and auxiliary compensation are applied. From 0 to some threshold voltage (e.g., 100 mV), the normal compensation ($C_{comp}$) plus the auxiliary compensation ($C_{aux}$) are applied. From the threshold voltage to V+ minus the threshold voltage, only the normal compensation ($C_{comp}$) is applied. And from the V+ minus the threshold voltage to V+, the normal compensation ($C_{comp}$) plus the auxiliary compensation ($C_{aux}$) are applied.

Figure 7:
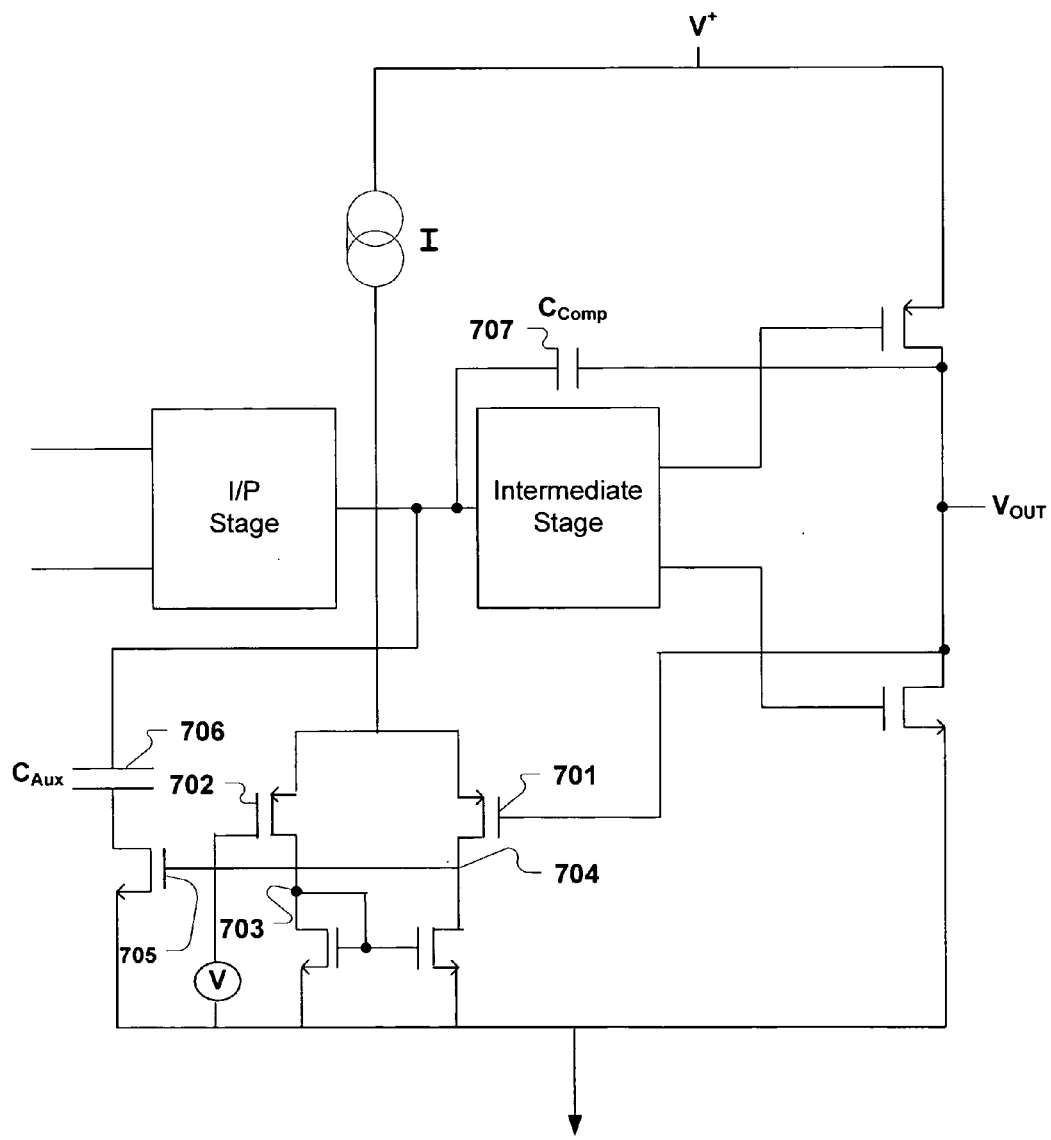
FIG. 7 shows an exemplary circuit diagram upon which an embodiment of the present invention can be applied to a MOS rail-to-rail op-amp.

FIG. 7 shows an exemplary circuit diagram upon which an embodiment of the present invention can be applied to a MOS rail-to-rail op-amp. In its normal mode of operation (e.g., when the output voltage is greater than 100 mV), transistor 701 is turned off. This means that all of the current, I, flows through the left hand side of the differential pair. In other words, the bias current will flow through p-channel transistor 702. In turn, this will cause node 703 to rise and, conversely, node 704 to collapse to near ground. Consequently, p-channel transistor 705 will be turned off. This effectively eliminates the auxiliary capacitor 706 from effecting the frequency response of the op-amp because its bottom plate is essentially floating. Thus, in the normal mode of operation, only the normal frequency compensation conferred by Ccomp capacitor 707 is active.

When the output voltage approaches ground (e.g. less than 100 mV), then the auxiliary capacitor ($C_{aux}$) 706 will start to be connected into the circuit. As the output voltages continues to decrease, more and more of the bias current, I, will be conducted through the P-channel transistor 701. No current will flow through P-channel transistor 702. Node 703 collapses to near ground, and node 704 will shoot up. This essentially turns on p-channel transistor 705 and causes the bottom plate of auxiliary capacitor 706 to be grounded. As a result, $C_{aux}$ 706 will provide additional auxiliary compensation to the op-amp.

In conclusion, an apparatus and method for selectively adding auxiliary frequency compensation for bipolar and/or MOS rail-to-rail op-amps has been disclosed. The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An operational amplifier with frequency compensation during saturation, comprising:
    a detector circuit used to detect said saturation;
    a switch coupled to said detector which is responsive to said detector;
    a frequency compensation circuit coupled to said switch, wherein frequency compensation is introduced when saturation occurs as indicated by said switch.

2. The apparatus according to claim 1, wherein said operational amplifier comprises a bipolar output device rail-to-rail operational amplifier.

3. The apparatus according to claim 1, wherein said operational amplifier comprises a MOS output device rail-to-rail operational amplifier.

4. The apparatus according to claim 1, wherein said detector circuit is coupled to an output device of said operational amplifier and detects conditions by which said output device becomes saturated.

5. The apparatus according to claim 1, wherein said switch comprises a transistor.

6. The apparatus according to claim 1, wherein said frequency compensation circuit includes an auxiliary capacitor which is switched in only when a transistor becomes saturated.

7. The apparatus according to claim 1, wherein said detector circuit comprises an inverse mode transistor.

8. The apparatus according to claim 1, wherein said detector circuit comprises an anti-saturation clamp.

9. A method for compensating frequency when saturation of an output device of a rail-to-rail operational amplifier occurs, comprising:
    detecting saturation by monitoring said output device of said operational amplifier;
    turning on a switch when saturation is detected;
    compensating frequency by providing additional frequency compensation when saturation occurs as indicated by said switch.

10. The method of claim 9 further comprising detecting saturation using an anti-saturation clamp.

11. The method of claim 9 further comprising detecting saturation using an inverse mode transistor.

12. The method of claim 9, wherein said output device comprises a bipolar transistor.

13. The method of claim 9, wherein said output device comprises a MOS transistor.

14. The method of claim 9, wherein said additional frequency compensation is provided by an auxiliary capacitor.

15. A circuit for providing additional frequency compensation when a bipolar output transistor of an operational amplifier enters saturation, comprising:
  a first frequency compensator which affects a frequency response of said operational amplifier;
  an auxiliary frequency compensator which affects said frequency response of said operational amplifier;
  a detector for detecting conditions when said output transistor of said operational amplifier becomes saturated;
  a controller coupled to said detector, wherein said controller selectively controls when said auxiliary frequency compensator is allowed to affect said frequency response of said operational amplifier according to when said detector determines when said operational amplifier is saturated.

16. The circuit of claim 15, wherein said first frequency compensator comprises a first capacitor and said auxiliary frequency compensator comprises a second capacitor.

17. The circuit of claim 15, wherein said operational amplifier comprises a bipolar rail-to-rail operational amplifier.

18. A circuit for providing additional frequency compensation when a MOS output transistor of an operational amplifier enters a linear region, comprising:
  a first frequency compensator which affects a frequency response of said operational amplifier;
  an auxiliary frequency compensator which affects said frequency response of said operational amplifier;
  a controller coupled to a detector, wherein said controller selectively controls when said auxiliary frequency compensator is allowed to affect said frequency response of said operational amplifier when said MOS output transistor enters said linear region.

19. The circuit of claim 18, wherein said first frequency compensator comprises a first capacitor and said auxiliary frequency compensator comprises a second capacitor.

20. The circuit of claim 18, wherein said operational amplifier comprises a MOS output device rail-to-rail operational amplifier.

21. The apparatus according to claim 1, wherein said frequency compensation circuit includes an auxiliary capacitor which is switched in when a transistor becomes saturated.

* * * * *